(12) United States Patent
Seike (10) Patent No.: US 9,887,271 B2
(45) Date of Patent: Feb. 6, 2018

(54) METAL-INSULATOR-METAL DIODES AND METHODS OF FABRICATION

(71) Applicant: Empire Technology Development LLC, Wilmington, DE (US)

(72) Inventor: Aya Seike, Tokyo (JP)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/908,899

(22) PCT Filed: Jul. 31, 2013

(86) PCT No.: PCT/US2013/052868
§ 371 (c)(1),
(2) Date: Jan. 29, 2016

(87) PCT Pub. No.: WO2015/016861
PCT Pub. Date: Feb. 5, 2015

(65) Prior Publication Data
US 2016/0172463 A1    Jun. 16, 2016

(51) Int. Cl.
*H01L 29/66* (2006.01)
*C23C 14/24* (2006.01)
(Continued)

(52) U.S. Cl.
CPC ........ *H01L 29/66151* (2013.01); *C23C 14/24* (2013.01); *C23C 14/54* (2013.01);
(Continued)

(58) Field of Classification Search
None
See application file for complete search history.

(56) References Cited

U.S. PATENT DOCUMENTS 4,549,194 A    10/1985  Calviello
6,368,705 B1   4/2002   Lynch et al.
(Continued)

FOREIGN PATENT DOCUMENTS

CN    103199117 A    7/2013
JP    2003007599 A   1/2003
(Continued)

OTHER PUBLICATIONS

Big lurking in it does not propagate light, and unknown possibilities evanescent light (near-field light), Published on Feb. 2004, accessed at http://web.archive.org/web/20110920012627/http://www.nikon.co.jp/profile/technology/core/optical/evanescent/index.htm, accessed on Dec. 12, 2015, pp. 1-4.
(Continued)

*Primary Examiner* — Alexander Ghyka
(74) *Attorney, Agent, or Firm* — Dorsey & Whitney LLP (57) ABSTRACT

Provided herein are embodiments relating to metal-insulator-metal diodes and their method of manufacture. In some embodiments, the metal-insulator-metal diodes can be made, in part, via the use of an evanescent wave on a photo resist. In some embodiments, this allows for finer manipulation of the photo resist and allows for the separation of one piece of metal into a first and second piece of metal. The first piece of metal can then be differentially treated from the second (for example, by annealing another metal to the first piece), to allow for a difference in the work function of the two pieces of metal.

20 Claims, 6 Drawing Sheets

(51) Int. Cl.
*H01L 45/00* (2006.01)
*C23C 14/54* (2006.01)
*G03F 7/16* (2006.01)
*G03F 7/20* (2006.01)
*G03F 7/32* (2006.01)
*H01L 21/67* (2006.01)
*H01L 29/861* (2006.01)

(52) U.S. Cl.
CPC ............... *G03F 7/162* (2013.01); *G03F 7/20* (2013.01); *G03F 7/32* (2013.01); *H01L 21/67069* (2013.01); *H01L 45/00* (2013.01); *H01L 29/861* (2013.01)

(56) References Cited

U.S. PATENT DOCUMENTS

| 6,455,403 | B1 | 9/2002 | Hwang et al. |
| 7,898,042 | B2 | 3/2011 | Yu et al. |
| 2006/0091496 | A1 | 5/2006 | Ulmer et al. |
| 2006/0124834 | A1 | 6/2006 | Mizutani et al. |
| 2008/0129187 | A1* | 6/2008 | Tamura .................. H01J 29/04 313/495 |
| 2008/0169464 | A1 | 7/2008 | Gong et al. |
| 2010/0081268 | A1 | 4/2010 | Schricker et al. |
| 2010/0291489 | A1 | 11/2010 | Moskivits et al. |
| 2011/0220959 | A1 | 9/2011 | Blick et al. |

FOREIGN PATENT DOCUMENTS

| JP | 2003232909 A | 8/2003 |
| WO | 2005031468 A1 | 4/2005 |
| WO | 2015016861 A2 | 2/2015 |

OTHER PUBLICATIONS

International Search Report for PCT/US2013/052868 dated Dec. 17, 2013.
Koji, I. et al., "10 nm pattern forming proximity field light lithography technology", available at https://web.archive.org/web/20060213235814/http://jstshingi.jp/bunya/pdf/102606.pdf, Feb. 13, 2006, 22 pages.
Ward, "Electrical and Optical Characterization of Molecular Nanojunctions", Sep. 2010; retrieved Dec. 17, 2015 at: http://natelson.web.rice.edu/theses/ward_thesis.pdf.

* cited by examiner

METAL-INSULATOR-METAL DIODES AND METHODS OF FABRICATION

CROSS-REFERENCE TO RELATED APPLICATION

This application is the U.S. National Stage filing under 35 U.S.C. § 371 of International Application No. PCT/US2013/052868, filed on Jul. 31, 2013. International Application No. PCT/US2013/052868 is incorporated herein by reference in its entirety and for any purpose.

TECHNICAL FIELD

The present application generally relates to metal-insulator-metal diodes.

BACKGROUND

Metal-insulator-metal diodes are useful in a variety of applications, including, for example, various IR sensors and detectors. In addition, metal-insulator-metal diodes can be superior to other silicon based electronics, such as silicon transistors, allowing more rapid electron transmission.

SUMMARY

In some embodiments, a metal-insulator-metal diode is provided. The diode can include a dielectric substrate, a first metal conductive layer disposed on the dielectric substrate, a second metal conductive layer disposed above the dielectric substrate and spaced apart from the first metal conductive layer, and a dielectric trench disposed between the first metal conductive layer and the second metal conductive layer.

In some embodiments a method of making a metal-insulator-metal diode is provided. The method can include providing a conductive layer on a dielectric substrate. The conductive layer can include a first metal. The method can include applying a photoresist layer on the conductive layer, exposing a portion of the photoresist to an evanescent wave, removing at least a portion of the photoresist exposed to the evanescent wave to expose a portion of the conductive layer, and etching the exposed portion of the conductive layer to form a trench separating a first region of the conductive layer and a second region of the conductive layer.

In some embodiments, a method of making a metal-insulator-metal diode is provided. The method can include providing a conductive layer on a dielectric substrate. The conductive layer can include a first metal. The method can further include applying a photoresist layer on the conductive layer, exposing a portion of the photoresist to a radiation, removing at least a portion of the photoresist exposed to the radiation to expose a portion of the conductive layer, and etching the exposed portion of the conductive layer to form a trench separating a first region of the conductive layer and a second region of the conductive layer. In some embodiments, the trench has a width of less than about 10 nm.

In some embodiments, a system for making a metal-insulator-metal diode is provided. The system can include a controller configured to execute instructions to facilitate making the metal-insulator-metal diode and one or more physical vapor deposition devices coupled to the controller. The physical vapor deposition devices can be together configured via the controller to apply a conductive layer to a substrate. The system can further include one or more spin coaters coupled to the controller. The spin coaters can be together configured via the controller to apply a first photoresist layer to the conductive layer. In some embodiments, the system can further include an evanescent wave device configured to apply an evanescent wave to the first photoresist layer to obtain an opening in the first photoresist layer to expose a portion of the conductive layer. In some embodiments, the system can further include a plasma etching device coupled to the controller. The plasma etching device can be manipulatable via the controller to etch the exposed portion of the conductive layer to form the trench separating a first region of the conductive layer and a second region of the conductive layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identity similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Provided herein are methods of fabricating metal-insulator-metal diodes with an ultra-thin insulator layer. In some embodiments, a metal electrode is provided by conventional lithography and dry etching. Following this, a trench is fabricated through the metal electrode to separate it into two electrodes. This trench can be created by the use of evanescent wave propagated through a nano-aperture (or "gap") which has smaller size in diameter compare with the wavelength of the exposure light to generate evanescent wave. In some embodiments, the separated half of the metal is alloyed with the metal, which is selectively deposited onto the separated metal to thereby provide a different work function. In some embodiments, by alloying the metals, the work function of the metal electrode can be modified for desired and/or better metal-insulator-metal diode characteristics.

In some embodiments, the metal-insulator-metal diode can include a dielectric substrate, a first metal conductive layer disposed on the dielectric substrate, a second metal conductive layer disposed on the dielectric substrate and spaced apart from the first metal conductive layer, and a dielectric trench disposed between the first metal conductive layer and the second metal conductive layer. As will be appreciated by one of skill in the art, the trench can be empty; however, in other embodiments, the trench can be filled with a relatively nonconducting material.

Figure 1:
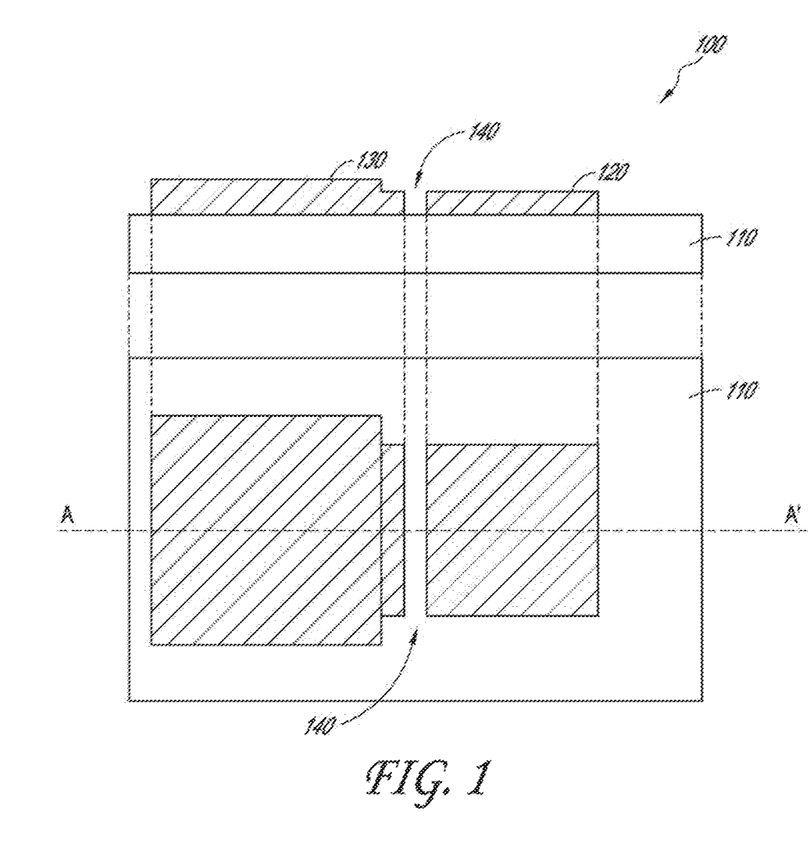
FIG. 1 is a depiction of some embodiments of a metal-insulator-metal diode.

FIG. 1 depicts two views of some embodiments of a metal-insulator-metal diode 100. The top panel is the cross-section of the bottom panel along A-A'. The metal-insulator-metal diode can include a substrate 110, a first conductive layer 120 over the substrate 110, and a second conductive laser 130 over the substrate 110. In some embodiments, there is a trench 140 between the first conductive layer 120 and the second conductive layer 130. In some embodiments, an insulating material can be positioned between the first conductive layer 120 and the second conductive layer 130 in the trench 140. Thus, in some embodiments, the trench 140 need not be a void, but can instead be an insulating material between the first conductive layer 120 and the second conductive layer 130.

In some embodiments, the trench can be equal to or less than 100 nm in width, for example, equal to or less than about 100 nm, 90 nm, 80 nm, 70 nm, 60 nm, 50 nm, 40 nm, 30 nm, 20 nm, or 10 nm, including any range between any two of the preceding values and any range beneath any one of the preceding values. In some embodiments, the trench is equal to or less than about 10 nm, for example, less than about 10 nm, 9 nm, 8 nm, 7 nm, 6 nm, 5 nm, 4 nm, 3 nm, 2 nm, or 1 nm, including any range between any two of the preceding values and any range beneath any one of the preceding values.

In some embodiments, the first metal conductive layer includes at least one elemental metal. In some embodiments, the elemental metal includes one or more of chromium, tungsten, molybdenum, gadolinium, aluminum, niobium, nickel gold, titanium, tantalum, or platinum. In some embodiments, the second metal conductive layer includes at least one elemental metal, including, for example, one or more of chromium tungsten, molybdenum, gadolinium, aluminum, niobium, nickel, gold, titanium, tantalum, or platinum. In some embodiments, the first, second, or first and second metal conductive layers include an alloy. In some embodiments, any of the elemental metals can be combined in any of the metal layers for the formation of a desired alloy. In some embodiments the conductive layer includes phosphorous, or arsenic. In some embodiments the conductive layer includes carbon nanotubes, carbon black, graphite, graphine, fullerene ($C_{60}$), black lead, or other conductive materials.

In some embodiments, the first metal conductive layer and the second metal conductive layer both include at least one elemental metal in common. In some embodiments, the common elemental metal includes at least one of chromium, tungsten, gadolinium, molybdenum, aluminum, niobium, nickel, gold, titanium, tantalum, or platinum.

In some embodiments, the first metal conductive layer has a first work function. In some embodiments, the second metal conductive layer has a second work function. In some embodiments, the absolute difference between the first work function and the second work function is at least about 0.1 eV, for example, 0.05 eV, 0.1 eV, 0.2 eV, 0.3 eV, 0.4 eV, 0.5 eV, 0.6 eV, 0.7 eV, 0.8 eV, 0.9 eV, 1 eV, 2 eV, 3 eV, 4 eV, 4.1, 4.55, 5 eV, 6 eV, 7 eV, 8 eV, 9 eV, 10 eV, or greater, including any range between any two of the preceding values and any range above any one of the preceding values.

In some embodiments, the first metal conductive layer 120 has a thickness of about 1 nm to about 1 μm, for example 1 nm, 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, or 1000 nm, including any range between any two of the preceding values. In some embodiments, the second metal conductive layer 130 has a thickness of about 1 nm to about 1 μm, for example 1 nm, 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, or 1000 nm, including any range between any two of the preceding values. In some embodiments, the first metal conductive layer is at least about 10% thicker than the second metal conductive layer, for example the first metal conductive layer is at least 1% thicker than the second metal conductive layer, for example, at least 1%, 10%, 20%, 30%, 40%, 50%, 60%, 70%, 80%, 90%, 100%, 200%, 300%, 400%, 500%, 600%, 700%, 800%, 900%, 1000%, or more in thickness, including any range between any two of the preceding values and any range above any one of the preceding values.

In some embodiments, the second metal conductive layer 130 has a thickness greater than the first metal conductive layer 120. In some embodiments, the second metal conductive layer is at least 1% thicker than the first metal conductive layer, for example, at least 1%, 10%, 20%, 30%, 40%, 50%, 60%, 70%, 80%, 90%, 100%, 200%, 300%, 400%, 500%, 600%, 700%, 800%, 900%, 1000%, or more in thickness, including any range between any two of the preceding values and any range above any one of the preceding values.

In some embodiments, the dielectric substrate includes and/or is part of a silicon wafer. In some embodiments, the dielectric substrate is made of silicon, quart, silicon carbide, etc. In some embodiments, the dielectric substrate can include SOI, SiC, or a flexible display.

In some embodiments, the metal-insulator-metal diode has an on-voltage of at least about 0.2 V, for example, 0.2 V, 0.3 V, 0.4 V, 0.5 V, 0.6 V, 0.7 V, 0.8 V, 0.9 V, 1 V, 2 V, 3 V, 4 V, 5 V, 6 V, 7 V, 8 V, 9 V, 10 V, 100 V or more, includes any range between any two of the preceding values and any range above any one of the preceding values.

In some embodiments, the metal-insulator-metal diode provided herein can be used for any type of device where a metal-insulator-metal diode can be used. In some embodiments, the metal-insulator-metal diode can be used in an IR sensor and/or an IR detector.

In some embodiments, a method of making a metal-insulator-metal diode is provided. The method can include providing a conductive layer on a dielectric substrate. The conductive layer can include a first metal (for example, any of those noted herein). The method can further include applying a photoresist layer on the conductive layer. In some embodiments, the photoresist layer can be a positive photoresist. In some embodiments, the photoresist layer can be a negative photoresist. The method can further include exposing a portion of the photoresist to an evanescent wave and removing at least a portion of the photoresist exposed to the evanescent wave to expose a portion of the conductive layer. The method can further include etching the exposed portion of the conductive layer to form a trench separating a first region of the conductive layer and a second region of the conductive layer.

In some embodiments, the method can further include applying a second metal to the first region of the conductive layer and annealing the first region of the conductive layer and the second metal applied to the first region of the conductive layer. In some embodiments, the second metal can be any elemental metal, for example, any of those noted herein.

FIGS. 2A-2G are schematics depicting some embodiments of methods of forming metal-insulator-metal diodes.

Figure 2A:
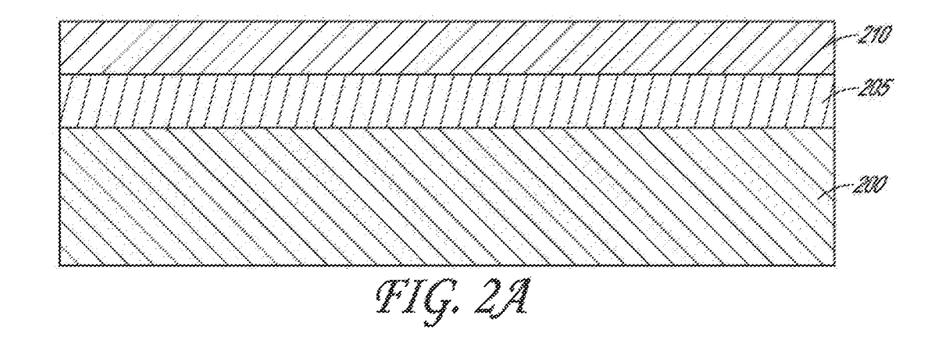
FIGS. 2A to 2G depict some embodiments of processes for making a metal-insulator-metal diode.

FIG. 2A depicts a starting configuration of a substrate 200, over which there is a conductive layer 205. Over the conductive layer, a photoresist 210 can be positioned.

Figure 2B:
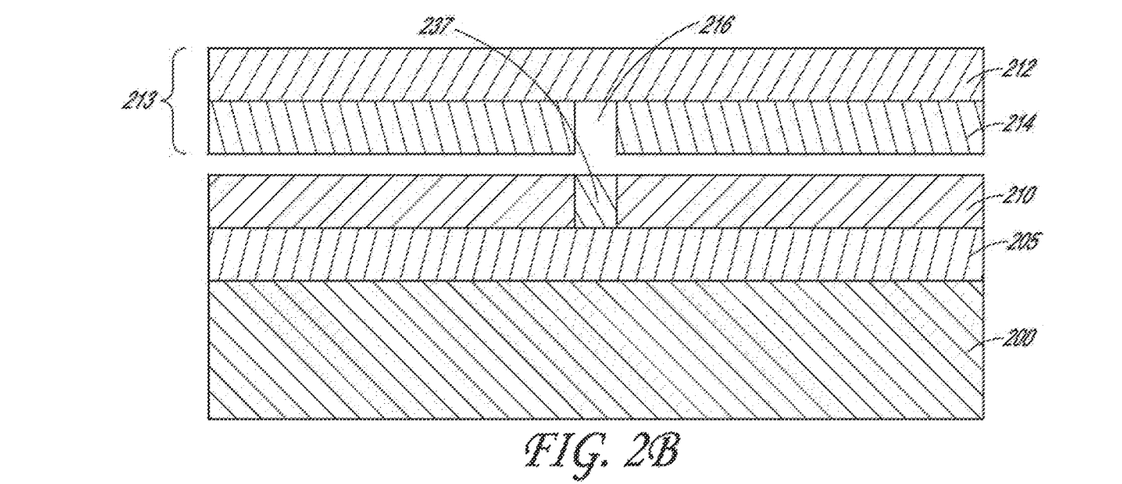

As depicted in FIG. 2B, in some embodiments, exposing the photoresist 210 to an evanescent wave can include applying radiation to a photomask 213. The photomask 213 can have an opening 216 with a width that is less than a wavelength of a peak emission of the radiation being applied to the photomask 213. The evanescent wave will be generated locally, at the opening 216. Thus, the opening 216 can closely correspond to the portion of the photoresist 237 that will then be exposed and thereby damaged. This allows for a precise manipulation of the photoresist 210, and thus, a precise manipulation of any material to be treated via the photoresist 210, such as the conductive layer 205, beneath the photoresist (or, more specifically, directly beneath the damaged portion of the photoresist 237. The way in which the evanescent wave is generated is not limited to any particular arrangement. In some embodiments, the evanescent wave can be generated throughout a substrate 212 of the photomask 213, with the opening 216 being used to manipulate the wave into a desired pattern. In some embodiments, radiation can be employed and directed to the photomask 213 in the desired manner, via the opening 216.

Figure 2C:
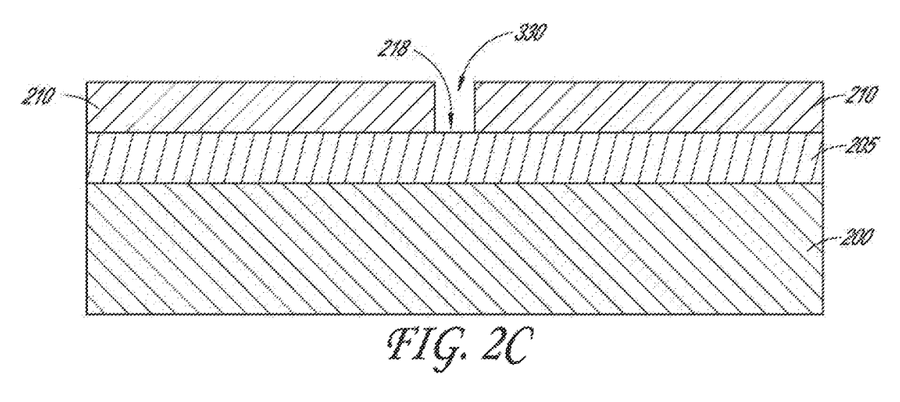

As depicted in FIG. 2C, in some embodiments, the generation of the evanescent wave localized to opening 216 results in the destruction of part of the photoresist 210, thereby resulting in the creation of an exposed portion 218 of the conductive layer 205, having walls formed by a portion of the photoresist 210. In some embodiments, the portion of the photoresist 237 (FIG. 2B) is merely damaged, and can be removed more completely by a wash or an etching in a develop. In some embodiments, the photoresist can include, for example, SAL 601 (Rohm and Haas) In some embodiments, to etch a 10 nm depth, one can employ 30 nm height of the photoresist. Thus, in some embodiments, the photo resist can be about three times the desired height.

In some embodiments, one then applies an etching process (such as a dry etch) to the arrangement in FIG. 2C, which allows the etchant to etch at the exposed portion 218 at the bottom of trench 330 (which was the damaged portion of the photoresist 237) of the conductive layer 205, while the photoresist 210 can protect the remaining section of the conductive layer 205.

Figure 2D:
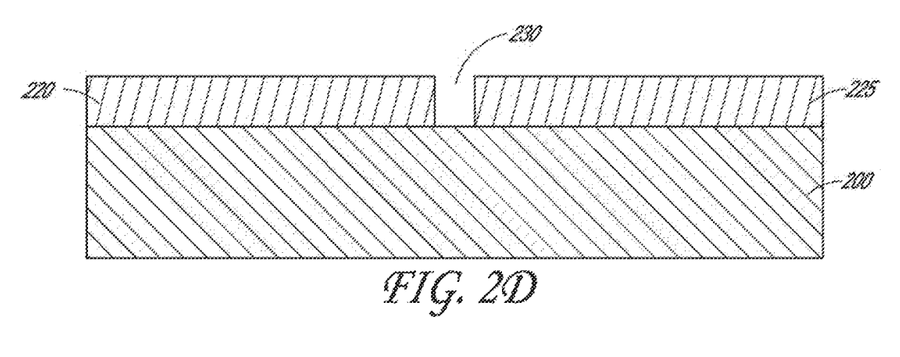

As depicted in FIG. 2D, the photoresist 210 can then be removed, resulting in an arrangement where the first region 220 of the conductive layer and the second region 225 of the conductive layer are separated by a trench 230. In some embodiments, this allows for the formation of a metal-insulator-metal arrangement, such as in a diode. In some embodiments, additional processing can be performed.

Figure 2E:
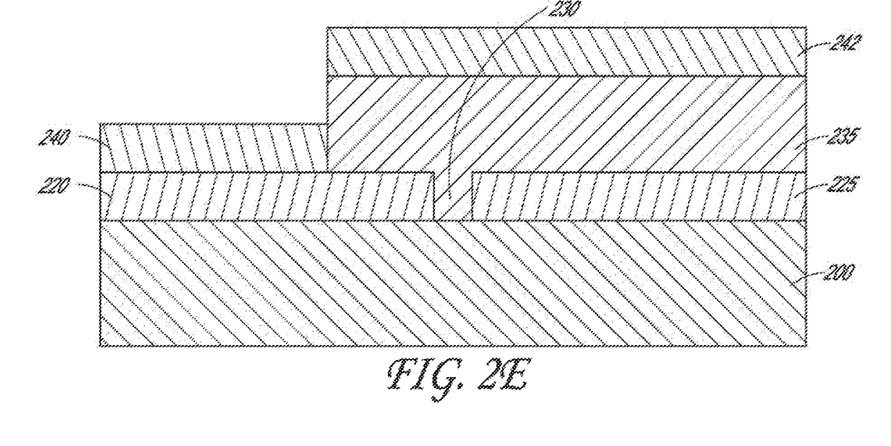
Figure 2F:
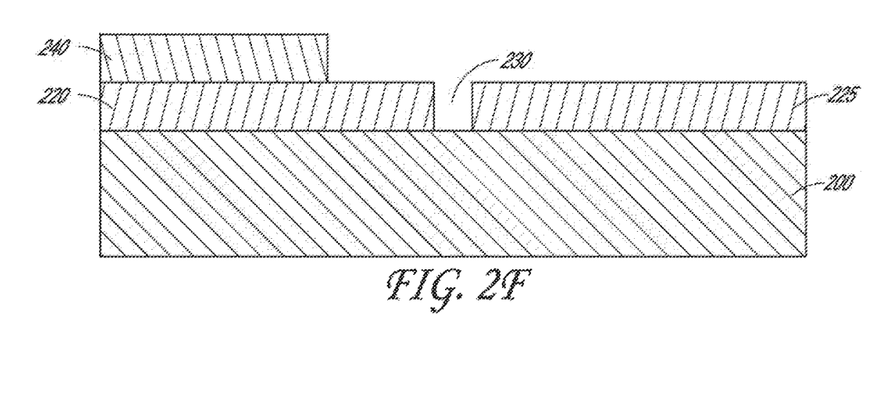

As illustrated in FIGS. 2E and 2F, in some embodiments, one can apply a second layer of metal to the arrangement. In some embodiments, prior to adding the second metal 240 and 242, one applies a second photoresist layer 235 over the trench 230 and the second region 225. One can then apply the second metal 240 to the first region 220 of the conductive layer. The application of the second metal can also result in coating the second photoresist layer 235 with a second portion of the second metal 242.

The method can further include removing the second photoresist layer 235, which will also result in the removal of the section of the second portion of the second metal 242. FIG. 2F depicts the resulting arrangement once the second photoresist layer 235 (and thus the second portion of the second metal 242 as well) is removed. This arrangement includes the substrate 200, with a second metal 240 on top of first region 220, separated via a trench 230 from the second region 225.

Figure 2G:
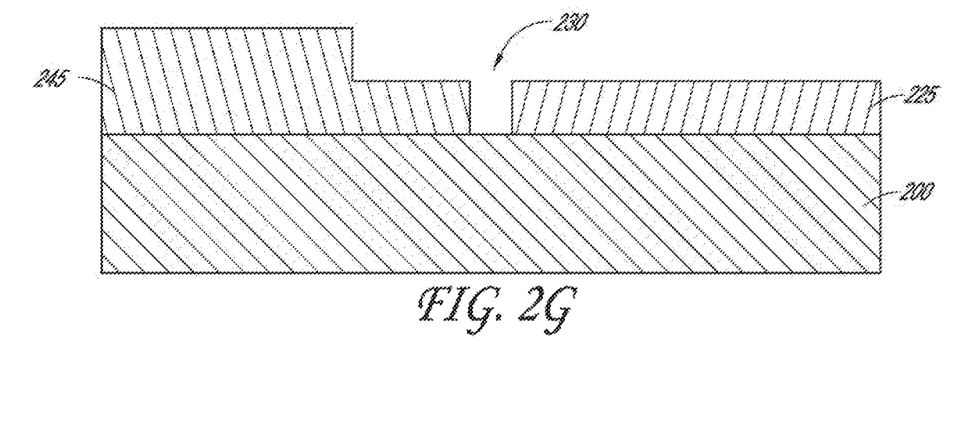

Finally, in some embodiments, the first metal of the first region 220 and second metal 240 can be annealed together to create an annealed alloy 245 (as shown in FIG. 2G). In some embodiments, the arrangement in FIG. 2G (the annealed alloy 245, separated by a trench 230 from the second region 225, on substrate 200) can be the same arrangement in discussed in regard to FIG. 1 above (the second conductive layer 130 separated by a trench 140 from the first conductive layer 120 on substrate 100). This arrangement can allow for the properties of the second conductive layer 130 (as shown in FIG. 1) to differ front the final properties of the first conductive layer 120 (as shown in FIG. 1).

In some embodiments, the width (that is, thickness) of the photomask 213 is equal to or less than about 1000 nm, for example, 1000 nm, 100 nm, 50 nm, 40 nm, 30 nm, 20 nm, 19 nm, 18 nm, 17 nm, 16 nm, 15 nm, 14 nm, 13 nm, 12 nm, 11 nm, 10 nm, 9 nm, 8 nm, 7 nm, 6 nm, 5 nm, 4 nm, 3 nm, 2 nm, 1 nm in width, including any range between any two of the preceding values. In some embodiments, the thickness of the photomask can be about three times the desired height.

In some embodiments, the opening 216 in the photomask 213 is formed by a chromium pattern. Thus, in some embodiments, the evanescent wave can be made by passing light through a chromium pattern. In some embodiments, the opening 216 can thus be a hole in the pattern (such as the chromium pattern 214). In some embodiments, the opening is equal to or less than 1000 nm, for example, 900 nm, 800 nm, 700 nm, 600 nm, 500 nm, 400 nm, 300 nm or less, including any range below any one of the preceding values and any range between any two of the values. In some embodiments, the size of the opening 216 is selected based upon the wavelength of light being used, such that the size of the opening is less than the wavelength of light being used so that an evanescent wave is generated, which in turn can be used to carve out and/or shape the photoresist 210.

In some embodiments, applying the photoresist layer on the conductive layer can be achieved by spin coating. In some embodiments, a self assembling monolayer (SAM) can be employed for patterning.

In some embodiments, removing at least a portion of the photoresist 237 exposed to radiation to expose the conductive layer 205 includes applying a developer to the damaged section of the photoresist. In some embodiments, after the developer is applied, one then etches the exposed portion 218 of the conductive layer 205 to form the trench 230 which separates a first region of the conductive layer 220 and a second region 225. In some embodiments, the etching can be achieved by any etching process, including, for example, dry etching.

In some embodiments, providing the conductive layer 205 on the dielectric substrate 200 includes sputtering the first metal on the dielectric substrate to form the conductive layer.

In some embodiments, the process of making the metal-insulator-metal diode includes the processing a silicon wafer.

In some embodiments, the first and second metals can include any suitable metal, including those noted above, such as chromium, tungsten, molybdenum, gadolinium aluminum, niobium, nickel, gold, titanium, tantalum, platinum, or any combination thereof.

In some embodiments, the conductive layer is made such that it has an appropriate thickness, including any of the thickness provided herein, such as a thickness of about 1 nm to about 1 μm.

In some embodiments, annealing the first region of the conductive layer and the second metal applied to the first region of the conductive layer includes heating the first region of the conductive layer and the second metal applied to the first region of the conductive layer to a temperature of about 100° C. to about 1000° C., for example, 100° C., 200° C., 300° C., 400° C., 500° C., 600° C., 700° C., 800° C., 900° C., or 1000° C., including any range between any two of the preceding values.

In some embodiments, the trench has a width of equal to or less than about 100 nm. In some embodiments, this can be achieved by moving the photomask 213 with the evanescent wave over the photoresist 210 repeatedly, until the desired width of the exposed portion 218 is achieved. In some embodiments, the width of the final trench is equal to or less than 50 nm, for example 50 nm, 40 nm, 30 nm, 20 nm, 10 nm, 9 nm, 8 nm, 7 nm, 6 nm, 5 nm or fewer nanometers, including any range between any two of the preceding values and any range beneath any one of the preceding values.

In some embodiments, rather than employing at evanescent wave, the process can employ radiation for weakening the photoresist. In some embodiments, the method of making a metal-insulator-metal diode can include providing a conductive layer on a dielectric substrate. The conductive layer can include a first metal. In some embodiments, the method can further include applying a photoresist layer on the conductive layer, exposing a portion of the photoresist to an amount of radiation, removing at least a portion of the photoresist exposed to the radiation to expose a portion of the conductive layer, and etching the exposed portion of the conductive layer to form a trench. The trench separates a first region of the conductive layer and a second region of the conductive layer. In some embodiments, the trench has a width of less than about 10 nm. In some embodiments, any of the process or aspects discussed herein in regard to the method involving an evanescent wave can be used in this method as well.

In some embodiments, a radiation source can be used in combination with an evanescent wave process. For example, an evanescent wave can be used for creating the trench between a first and second region, but a radiation source can be employed for subsequent manipulations via subsequent resists (such as via the use of a positive photoresist in the arrangement in FIG. 2E).

As noted above, in some embodiments, the method includes applying a second metal to the first region of the conductive layer and annealing the first region of the conductive layer and the second metal applied to the first region of the conductive layer. Thus, the first region can have electrical properties that are different from the second region.

Figure 3:
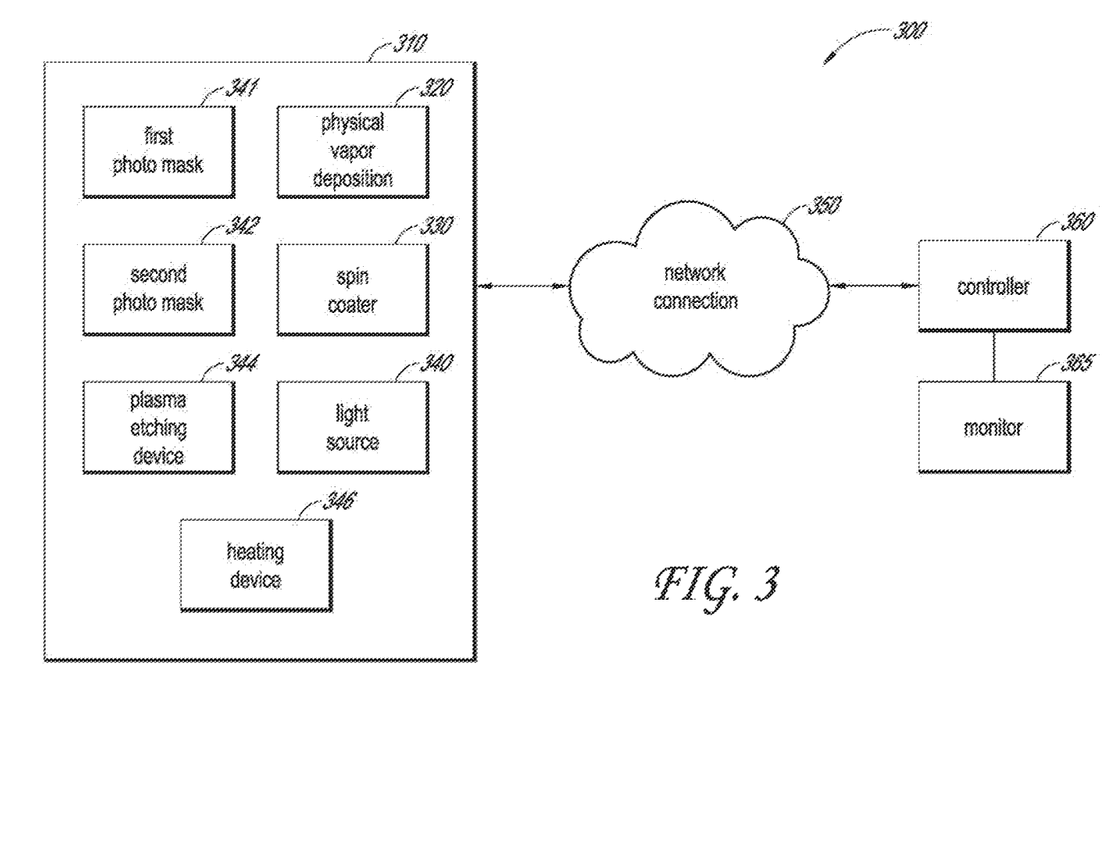
FIG. 3 is schematic representation of some embodiments of a system for manufacturing a metal-insulator-metal diode

In some embodiments, the method noted above can be performed by a variety of devices, process, and/or systems. FIG. 3 is a schematic depicting some embodiments of a system 300 that can make a metal-insulator-metal diode. In some embodiments, the system includes a controller 360 that is configured to execute instructions to facilitate making the metal-insulator-metal diode. The controller can control one or more devices 310 for making the noted metal-insulator-metal diodes. In some embodiments, the controller 360 can control one or more of the devices 310 directly. In some embodiments, the controller 360 can control one or more of the devices via a network connection 350. In some embodiments, any of the devices 310 can be separately controllable, either by a single controller 360, or by multiple controllers. In some embodiments, the status of the manufacturing process, state of any device 310, and/or properties within the system generally can be provided to a user via a monitor 365 or other output device.

In some embodiments one or more physical vapor deposition devices 320 can be coupled to the controller 360. In some embodiments, the physical vapor deposition devices 320 are together configured via the controller 360 to apply a conductive layer to a substrate.

In some embodiments, the system can further include one or more spin coaters 330 coupled to the controller 360. The one or more spin coaters 330 are together configured via the controller 360 to apply a first photoresist layer to the conductive layer. In some embodiments, this can be a negative photoresist layer. In some embodiments, this can be a positive photoresist layer.

In some embodiments, the system 300, further includes an evanescent wave device, which can generically be a light source 340, which, when paired with an appropriately sized opening 216 in a photomask 341 is configured to provide and thereby allow for the application of evanescent wave to the first photoresist layer. The evanescent wave can provide an opening in the first photoresist layer to expose a portion of the conductive layer. In some embodiments, the light source can be any radiation source. In some embodiments, the evanescent wave device includes a light source of the appropriate wavelength and location so was to produce the evanescent wave (by, for example, total internal reflection or by the application of light having a larger wavelength than the size of a gap in the photomask).

In some embodiments, the system further includes a plasma etching device 344 coupled to the controller 360. The plasma etching device 344 is manipulatable via the controller 360 to etch the exposed portion of the conductive layer to form the trench separating a first region of the conductive layer and a second region of the conductive layer. In some embodiments, a dry etching system can be included, so as to remove any section of the resist that has been damaged by the evanescent wave.

In some embodiments, the light source 340 is coupled to the controller. In some embodiments, the light source 340 is configured via the controller 360 to emit radiation effective to pattern a second photoresist layer 342 applied to at least the trench and the second region of the conductive layer by the spin coater 330. In some embodiments, the light source 340 can be used for the generation of the evanescent wave. In some embodiments, a different light source is used for the generation of the evanescent wave (in contrast to the patterning of a second photoresist). Thus, in some embodiments, the devices 310 and/or system 300 can include two or more light sources.

In some embodiments, the system further includes a photomask configured to provide a radiation pattern to the second photoresist layer that is effective to obtain an opening in the second photoresist layer to expose a portion of the first region of the conductive layer. In some embodiments, the photomask is configured to provide a radiation pattern to the first photoresist layer to expose a surface of the conductive layer. In some embodiments, a single photomask can be employed for the generation of the evanescent wave and for any additional adjustments to any additional photoresists. In some embodiments, two or more photomasks are present. In some embodiments, a single photomask can include a gap of a desired size for the generation of an evanescent wave, as well as a pattern for the manipulation of photoresists without the use of an evanescent wave.

In some embodiments, the system 300 further includes a heating device 346. In some embodiments, the heating device can be configured (for example, controllable through the controller 360) to anneal the conductive layer applied to the substrate and the second metal applied to the portion of the conductive layer by the physical vapor deposition device 320. In some embodiments, the heater can be configured to apply heat at other times throughout any of the methods provided herein.

In some embodiments, there is a single light source 340. In some embodiments, the single light source can serve as a healing device 346 as well as an option for generating the light for the evanescent wave. In some embodiments, the light source can emit visible light and/or UV light. In some embodiments, different filters can be positioned in front of the light source, so that the desired wavelength is transmitted. In some embodiments, the controller 360 can control which filters are employed.

In some embodiments, one or more separate light sources can be employed. Thus, in some embodiments, the light source need not be a broad spectrum light source, but instead light sources with more specific wavelengths can be used, reducing or removing the need for a filter. In some embodiments, no filter is required, even with a broad spectrum light source.

In some embodiments, the evanescent wave device includes a second photomask 342 having a chromium pattern disposed on a transparent substrate. In some embodiments, any photomask with a gap narrow enough to create an evanescent wave can be employed. In some embodiments, at least one of the light sources is configured to emit ultraviolet radiation. In some embodiments, at least one of the light sources is configured to emit infrared radiation.

In some embodiments, at least one of the spin coaters is configured to apply a metal to the conductive layer. The metal can include at least one of chromium, tungsten, molybdenum, gadolinium, aluminum, niobium, nickel, gold, titanium, tantalum, and platinum. In some embodiments, a supply of the metal is in communication with the spin coater.

In some embodiments, the use of an evanescent wave to treat a photoresist layer (positive or negative) can be employed for other systems or methods (outside of metal-insulator-metal diodes). In some embodiments, the evanescent wave can be used on a positive photoresist. In some embodiments, the evanescent wave can be used on a negative photoresist.

In some embodiments, the first photoresist layer is a negative photoresist. In some embodiments, the second photoresist layer is a negative photoresist. In some embodiments, the first photoresist layer is a positive photoresist. In some embodiments, the second photoresist layer is a positive photoresist.

In some embodiments, any form of evanescent wave (which encompasses terms such as "evanescent light" and "evanescent field") can be used to adjust and/or manipulate the photoresist. In some embodiments, the wave can be created by light that undergoes total internal reflection at a boundary. In some embodiments, this boundary can be located at gap 216, so that the field can pass through the gap and interact with the portion of the photoresist 237.

Conventional planar metal-insulator-metal diodes can suffer from leakage current via the insulator layer due to 1) non-uniform thickness and 2) poor quality of the insulator layer. In addition, due to the increase in parasitic capacitance, current/voltage (IV) characteristics of the diode are degraded, resulting in increasing diode-resistance. In some embodiments, use of one or more of the approaches outlined herein, (for example, employing an evanescent wave), can address and/or reduce one or both of these issues when employed as provided herein.

In some embodiments, one can use evanescent lithography for patterning a nano-gap for the production of a metal-insulator-metal device. In some embodiments, the work function of the metal electrodes in the metal-insulator-metal diode can be selectively modified by the process outlined herein (such as the subsequent addition of another metal and alloying of the metals). In some embodiments, one does not require additional equipment apart from that outlined herein and those conventional for conventional semiconductor processes.

In some embodiments, the metal-insulator-metal diode can be used as a rectifier embedded in IR THz devices. In some embodiments the rectifier can allow for further reduction in parasitic resistance for improved detection precision. In some embodiments, a metal-insulator-metal diode produced as described herein can allow for further downsizing in thickness of the insulator layer. In some embodiments, this is possible because it allows for a more uniform thickness and/or a higher quality insulator layer. In addition, in some embodiments, the current-voltage characteristics are not as degraded in this arrangement, thereby allowing for lower diode-resistance.

In an illustrative embodiment, any of the operations, processes, etc. described herein can be implemented as computers-readable instructions stored on a computer-readable medium. The computer-readable instructions can be executed by a processor of a mobile unit, a network element, and/or any other computing device.

There is little distinction left between hardware and software implementations of aspects of systems, the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, and/or examples. Insofar as such block diagrams, flowcharts, and/or examples contain one or more functions and/or operations, it will be understood by those within the art that each function and/or operation within such block diagrams, flowchart, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set form herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological system, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

Example 1

Manipulating a Photoresist Via an Evanescent Wave

The present example describes approaches for patterning a negative resist using an evanescent wave. A first metal, tungsten, is deposited on a substrate by chemical vapor deposition. A negative resist is then deposited onto the tungsten layer A lithography photomask is then provided. The photomask includes a substrate upon which there is a chromium pattern. The chromium pattern includes gratings that are smaller in width than 500 nm. The photomask is then exposed to light having a wavelength of 600 nm or more, so as to use the photomask to generate an evanescent wave at the gratings.

The evanescent wave will be localized around the gaps in the grating. The wave is then used to damage the negative resist layer. The damaged region of the negative resist is etched off by immersing the negative resist in a developer. This results in the creation of a patterned negative resist layer. This process allows one to create a very precise pattern in a negative resist that is positioned over a first metal layer of tungsten.

Example 2

Method of Making a Metal-Insulator-Metal Diode

The present example describes how to create a metal-insulator-metal diode. The first metal layer (tungsten) that is covered with a patterned negative resist as outlined in Example 1 is provided. The tungsten metal layer is then patterned, via Argon plasma using the negative resist as a dry aching mask. This results in the tungsten metal layer being split into a first region and a second region, with an insulating trench between the two regions. The resist mask is then washed off.

A positive photoresist is then deposited on the surface of the metal and the positive photoresist layer is patterned by lithography. A second metal (platinum) is then evaporated onto the surface of the substrate. The positive photoresist is then washed off with an organic solution, leaving the platinum on just the first region, but not the second region (which will have been blocked via the positive photoresist layer). The result is that the first region of the first metal (of tungsten) will now have the second metal (platinum) on it, the second region of the first metal (also of tungsten) will not have the second metal on it, and the insulating trench will separate the first region from the second region.

The substrate can then be annealed to alloy the first metal and the second metal. This will result in an alloy of tungsten and platinum on the first region of the diode (which can have a targeted work function $\Phi$), separated via a trench, from the second region, that is made of tungsten alone. The use of the above evanescent wave allows for the precise formation of a trench between the two regions of metal for a superior metal-insulator-metal diode.

Example 3

Method of Using a System for Manufacturing a Metal-Insulator-Metal Diode

The present example outlines the use of a system in the preparation of a metal-insulator-metal diode. A system for manufacturing metal-insulator-metal diodes is provided. The system can include a controller that is configured to execute instructions to facilitate making the metal-insulator-metal diode. The system includes a physical vapor deposition device coupled to the controller so that the control can control the physical vapor deposition device. The system further includes a spin coater coupled to the controller. The system further includes a light source, configured to apply an evanescent wave to the first photoresist. The light source is coupled to and controlled by the controller. The system further includes a plasma etching device coupled to the controller.

Through the controller, a user applies a conductive layer of tungsten to a substrate. The controller is then used to apply a negative photoresist layer on top of the tungsten via the spin coater. Via the controller, the negative photoresist is then treated with an evanescent wave to damage the section of the negative photoresist that one wishes to remove. The controller is then used to control the plasma etching device to etch the tungsten layer into two separate regions.

The use of the above evanescent wave allows for precise formation of a trench between the two regions of metal.

What is claimed is:

1. A method to make a metal-insulator-metal diode, the method comprising:
   providing a conductive layer on a dielectric substrate, wherein the conductive layer comprises a first metal;
   applying a photoresist layer on the conductive layer;
   exposing a portion of the photoresist layer, to a light source emission, to damage the portion of the photoresist layer;
   removing the damaged portion of the photoresist layer to expose a portion of the conductive layer;
   etching the exposed portion of the conductive layer to form a trench that separates a first region of the conductive layer and a second region of the conductive layer;
   applying a second metal on the first region of the conductive layer; and
   annealing the first metal in the first region of the conductive layer and the second metal applied on the first region of the conductive layer into an annealed alloy, wherein the trench separates the annealed alloy from the second region of the conductive layer.

2. The method of claim 1, wherein exposing the portion of the photoresist layer to the light source emission comprises applying a radiation to a photomask having an opening with a width that is less than a wavelength of a peak emission of the radiation, wherein the opening corresponds to the portion of the photoresist layer exposed to the light source emission.

3. The method of claim 2, wherein applying the radiation to the photomask includes applying the radiation to a photomask having a width less than about 100 nm.

4. The method of claim 2, further comprising using a chromium pattern to form the opening in the photomask.

5. The method of claim 1, wherein applying the photoresist layer on the conductive layer comprises spin coating of the conductive layer with the photoresist layer.

6. The method of claim 1, wherein removing the damaged portion of the photoresist layer comprises applying a developer to the damaged portion of the photoresist layer.

7. The method of claim 1, wherein etching the exposed portion of the conductive layer to form the trench that separates the first region of the conductive layer and the second region of the conductive layer comprises dry etching the exposed portion of the conductive layer.

8. The method of claim 1, wherein applying the second metal on the first region of the conductive layer comprises:
   forming a mask layer on at least the trench and the second region of the conductive layer;
   applying the second metal to an exposed portion of the first region of the conductive layer; and
   removing the mask layer.

9. The method of claim 1, wherein providing the conductive layer on the dielectric substrate comprises sputtering the first metal on the dielectric substrate.

10. The method of claim 1, wherein providing the conductive layer on the dielectric substrate comprises providing the conductive layer on a silicon wafer.

11. The method of claim 1, wherein the first metal includes chromium, tungsten, molybdenum, gadolinium, aluminum, niobium, nickel, gold, titanium, tantalum, or platinum, and wherein the second metal includes chromium, tungsten, molybdenum, gadolinium, aluminum, niobium, nickel, gold, titanium, tantalum, or platinum.

12. The method of claim 1, wherein providing the conductive layer includes providing a conductive layer that has a thickness of about 1 nm to about 1 µm.

13. The method of claim 1, wherein annealing the first metal in the first region of the conductive layer and the second metal applied on the first region of the conductive layer comprises heating the first region of the conductive layer and the second metal applied on the first region of the conductive layer at a temperature of about 100° C. to about 1000° C.

14. The method of claim 1, wherein etching the exposed portion of the conductive layer to form the trench includes etching the exposed portion of the conductive layer to form a trench that has a width of less than about 10 nm.

15. The method of claim 1, wherein the photoresist layer includes a first photoresist layer, and wherein the method further comprises:
   applying a second photoresist layer on a covered part of the first region of the conductive layer, on the trench, and on the second region of the conductive layer, wherein an exposed part of the first region of the conductive layer does not have the second photoresist layer applied, and wherein applying the second metal on the first region of the conductive layer comprises applying the second metal on the exposed part of the first region of the conductive layer and on the second photoresist layer; and
   removing the second photoresist layer to remove the second metal from the covered part of the first region of the conductive layer, from the trench, and from the second region of the conductive layer.

16. The method of claim 15, wherein the light source emission includes a first light source emission, wherein removing the second photoresist layer comprises exposing the second photoresist layer to a second light source emission, and wherein the second light source emission is selected from among: an evanescent wave or a radiation.

17. A method to make a metal-insulator-metal diode, the method comprising:
   providing a conductive layer on a dielectric substrate, wherein the conductive layer comprises a first metal;
   applying a photoresist layer on the conductive layer;
   exposing a portion of the photoresist layer, to a light source emission, to damage the portion of the photoresist layer;
   removing the damaged portion of the photoresist layer to expose a portion of the conductive layer;
   etching the exposed portion of the conductive layer to form a trench that separates a first region of the conductive layer and a second region of the conductive layer;
   forming a mask layer on a covered part of the first region of the conductive layer, on the trench, and on the second region of the conductive layer, wherein an exposed part of the first region of the conductive layer does not have the mask layer applied;
   applying a second metal on the exposed part of the first region of the conductive layer and to the mask layer; and
   removing the mask layer to remove the second metal from the covered part of the first region of the conductive layer, from the trench, and from the second region of the conductive layer.

18. The method of claim 17, further comprising annealing the second metal on the exposed part of the first region of the conductive layer and the first metal in the first region of the conductive layer into an annealed alloy.

19. The method of claim 18, wherein:
   the first metal has a first work function;

annealing the second metal on the exposed portion of the first region of the conductive layer and the first metal in the first region of the conductive layer into the annealed alloy comprises annealing the second metal and the first metal into an annealed alloy having a second work function; and a difference between the first work function and the second work function is about 0.05 eV to 10 eV.

20. The method of claim 17, wherein:

exposing the portion of the photoresist layer to the light source emission to damage the portion of the photoresist layer comprises exposing the photoresist layer to an evanescent wave from a first light source; and removing the mask layer comprises exposing the mask layer to a radiation from a second light source.

\* \* \* \* \*

UNITED STATES PATENT AND TRADEMARK OFFICE
CERTIFICATE OF CORRECTION

| | |
|---|---|
| PATENT NO. | : 9,887,271 B2 |
| APPLICATION NO. | : 14/908899 |
| DATED | : February 6, 2018 |
| INVENTOR(S) | : Seike |

It is certified that error appears in the above-identified patent and that said Letters Patent is hereby corrected as shown below:

In the Specification

In Column 1, Line 36, delete "embodiments a" and insert -- embodiments, a --, therefor.

In Column 2, Line 27, delete "is schematic" and insert -- is a schematic --, therefor.

In Column 2, Line 28, delete "diode" and insert -- diode. --, therefor.

In Column 2, Line 34, delete "identity" and insert -- identify --, therefor.

In Column 3, Line 9, delete "laser 130" and insert -- layer 130 --, therefor.

In Column 3, Line 33, delete "nickel gold," and insert -- nickel, gold, --, therefor.

In Column 3, Line 36, delete "chromium tungsten," and insert -- chromium, tungsten, --, therefor.

In Column 3, Line 42, delete "embodiments the" and insert -- embodiments, the --, therefor.

In Column 3, Line 43, delete "embodiments the" and insert -- embodiments, the --, therefor.

In Column 4, Line 29, delete "quart," and insert -- quartz, --, therefor.

In Column 4, Line 35, delete "includes" and insert -- including --, therefor.

In Column 5, Line 13, delete "210, and" and insert -- 210; and --, therefor.

In Column 5, Line 33, delete "develop." and insert -- developer. --, therefor.

In Column 5, Line 34, delete "(Rohm and Haas) In" and insert -- (Rohm and Haas). In --, therefor.

Signed and Sealed this
Fifth Day of June, 2018

Andrei Iancu
*Director of the United States Patent and Trademark Office*

In Column 5, Line 42, delete "trench 330" and insert -- spin coater 330 --, therefor.

In Column 6, Line 10, delete "in discussed" and insert -- as discussed --, therefor.

In Column 6, Line 12, delete "substrate 100)." and insert -- substrate 110). --, therefor.

In Column 6, Line 15, delete "front" and insert -- from --, therefor.

In Column 6, Line 57, delete "dielectric substrate 200" and insert -- dielectric substrate --, therefor.

In Column 6, Lines 65-66, delete "gadolinium aluminum," and insert -- gadolinium, aluminum, --, therefor.

In Column 7, Line 25, delete "at" and insert -- an --, therefor.

In Column 8, Line 8, delete "embodiments one" and insert -- embodiments, one --, therefor.

In Column 8, Line 30, delete "was to" and insert -- as to --, therefor.

In Column 9, Line 14, delete "healing" and insert -- heating --, therefor.

In Column 9, Lines 23-24, delete "instead light" and insert -- instead, light --, therefor.

In Column 10, Line 18, delete "embodiments the" and insert -- embodiments, the --, therefor.

In Column 10, Line 30, delete "computers-readable" and insert -- computer-readable --, therefor.

In Column 10, Line 35, delete "systems, the" and insert -- systems; the --, therefor.

In Column 10, Line 57, delete "flowchart," and insert -- flowcharts, --, therefor.

In Column 11, Line 7, delete "and or" and insert -- and/or --, therefor.

In Column 11, Lines 18-19, delete "a hard disk drive, a CD, a DVD," and insert -- a hard disk drive (HDD), a compact disc (CD), a digital versatile disc (DVD), --, therefor.

In Column 11, Line 22, delete "communications link," and insert -- communication link, --, therefor.

In Column 11, Line 26, delete "form" and insert -- forth --, therefor.

In Column 12, Line 18, delete "system," and insert -- systems, --, therefor.

In Column 12, Line 38, delete "recitation no" and insert -- recitation, no --, therefor.

CERTIFICATE OF CORRECTION (continued)
U.S. Pat. No. 9,887,271 B2

In Column 12, Line 60, delete "general such" and insert -- general, such --, therefor.

In Column 12, Line 67, delete "general such" and insert -- general, such --, therefor.

In Column 13, Line 55, delete "layer" and insert -- layer. --, therefor.

In Column 13, Line 57, delete "substrate upon" and insert -- substrate, upon --, therefor.

In Column 14, Line 14, delete "aching" and insert -- etching --, therefor.